United States Patent
Felsenthal et al.

(10) Patent No.: US 6,217,272 B1
(45) Date of Patent: Apr. 17, 2001

(54) IN-LINE SPUTTER DEPOSITION SYSTEM

(75) Inventors: David Felsenthal, Marblehead; Chunghsin Lee, Lynnfield; Piero Sferlazzo, Marblehead, all of MA (US)

(73) Assignee: Applied Science and Technology, Inc., Wilmington, MA (US)

(*) Notice: Subject to any disclaimer, the term of this patent is extended or adjusted under 35 U.S.C. 154(b) by 0 days.

(21) Appl. No.: 09/404,516

(22) Filed: Sep. 23, 1999

Related U.S. Application Data (60) Provisional application No. 60/116,721, filed on Jan. 21, 1999, and provisional application No. 60/102,610, filed on Oct. 1, 1998.

(51) Int. Cl.$^7$ .................................................. B65G 49/07
(52) U.S. Cl. .................. 414/217; 414/935; 414/939; 414/941
(58) Field of Search .................. 414/217, 939, 414/935, 941

(56) References Cited

U.S. PATENT DOCUMENTS

| | | | |
|---|---|---|---|
| 3,902,615 | 9/1975 | Levy et al. | 214/301 |
| 3,972,424 | 8/1976 | Levy et al. | 214/1 Q |
| 4,008,815 | 2/1977 | Fisk | 214/17 C |
| 4,405,435 | 9/1983 | Tateishi et al. | |
| 4,437,961 | 3/1984 | Routh et al. | 204/192 EC |
| 4,534,695 | * 8/1985 | Stump et al. | 414/749 |
| 4,558,984 | * 12/1985 | Garrett | 414/217 X |
| 4,586,743 | 5/1986 | Edwards et al. | 294/86.4 |
| 4,668,365 | 5/1987 | Foster et al. | 204/192.23 |
| 4,715,921 | 12/1987 | Maher et al. | 156/345 |
| 4,747,928 | 5/1988 | Takahashi et al. | |
| 4,785,962 | 11/1988 | Toshima | 220/260 |
| 4,819,167 | 4/1989 | Cheng et al. | 364/167.01 |
| 4,842,683 | 6/1989 | Cheng et al. | 156/345 |
| 4,872,947 | 10/1989 | Wang et al. | 156/643 |
| 4,892,753 | 1/1990 | Wang et al. | 427/38 |
| 4,911,597 | 3/1990 | Maydan et al. | 414/217 |
| 4,951,601 | 8/1990 | Maydan et al. | 118/719 |
| 4,962,441 | 10/1990 | Collins | 361/234 |
| 5,000,113 | 3/1991 | Wang et al. | 118/723 |
| 5,013,385 | 5/1991 | Maher et al. | 156/345 |
| 5,046,909 | 9/1991 | Murdoch | 414/225 |
| 5,102,495 | 4/1992 | Maher et al. | 156/643 |
| 5,199,483 | 4/1993 | Bahng | 165/1 |
| 5,215,619 | 6/1993 | Cheng et al. | 156/345 |

(List continued on next page.)

FOREIGN PATENT DOCUMENTS

| | | |
|---|---|---|
| 2 171 119 | 8/1986 | (GB). |
| 63-024632 | 2/1988 | (JP). |
| 03094070 | 4/1991 | (JP). |
| 05339723 | 12/1993 | (JP). |

OTHER PUBLICATIONS

"Automatic System for Single Wafer Reactive Ion Etching," *IBM Technical Disclosure Bulletin*, vol. 33, No. 2, Jul. 1990, pp.239–242.

*Primary Examiner*—Steven A. Bratlie
(74) *Attorney, Agent, or Firm*—Testa, Hurwitz & Thibeault, LLP

(57) ABSTRACT

An apparatus for simultaneously transporting and processing substrates is described. The apparatus includes a load lock that stores at least one substrate prior to processing and that stores at least one substrate after processing. A first transport mechanism transports at least one substrate into and out of the load lock. A multi-stage elevator is adapted to receive the first transport mechanism. A first process chamber is vertically disposed from the multi-stage elevator. The multi-stage elevator vertically transports at least one substrate into and out of the first process chamber. A second process chamber may be coupled to the multi-stage elevator. A second transport mechanism transports at least one substrate between the multi-stage elevator and the second process chamber.

27 Claims, 9 Drawing Sheets

U.S. PATENT DOCUMENTS

| | | | |
|---|---|---|---|
| 5,224,809 | 7/1993 | Maydan et al. | 414/217 |
| 5,227,708 | 7/1993 | Lowrance | 318/640 |
| 5,280,983 | 1/1994 | Maydan et al. | 294/119.1 |
| 5,292,393 | 3/1994 | Maydan et al. | 156/345 |
| 5,308,431 | 5/1994 | Maher et al. | 156/345 |
| 5,315,473 | 5/1994 | Collins et al. | 361/234 |
| 5,344,542 | 9/1994 | Maher et al. | 204/298.15 |
| 5,345,999 | 9/1994 | Hosokawa | 165/80.2 |
| 5,354,715 | 10/1994 | Wang et al. | 437/238 |
| 5,355,066 | 10/1994 | Lowrance | 318/640 |
| 5,360,996 | 11/1994 | Nulman et al. | 257/767 |
| 5,362,526 | 11/1994 | Wang et al. | 427/573 |
| 5,363,872 | 11/1994 | Lorimer | 137/1 |
| 5,371,042 | 12/1994 | Ong | 437/194 |
| 5,387,067 | 2/1995 | Grunes | 414/217 |
| 5,391,035 | 2/1995 | Krueger | 414/217 |
| 5,399,387 | 3/1995 | Law et al. | 427/574 |
| 5,427,666 | 6/1995 | Mueller et al. | 204/192.17 |
| 5,443,995 | 8/1995 | Nulman | 437/197 |
| 5,447,409 | 9/1995 | Grunes et al. | 414/744.6 |
| 5,460,689 | 10/1995 | Raaijmakers et al. | 156/643.1 |
| 5,469,035 | 11/1995 | Lowrance | 318/568.1 |
| 5,512,320 | 4/1996 | Turner et al. | 427/255 |
| 5,521,120 | 5/1996 | Nulman et al. | 437/190 |
| 5,534,231 | 7/1996 | Savas | 216/67 |
| 5,538,390 | 7/1996 | Salzman | 414/786 |
| 5,556,147 | 9/1996 | Somekh et al. | 294/64.1 |
| 5,556,248 | 9/1996 | Grunes | 414/416 |
| 5,563,798 | 10/1996 | Berken et al. | 364/478.06 |
| 5,566,744 | 10/1996 | Tepman | 165/80.1 |
| 5,570,994 | 11/1996 | Somekh et al. | 414/786 |
| 5,579,718 | 12/1996 | Freerks | 118/733 |
| 5,607,009 | 3/1997 | Turner et al. | 165/48.1 |
| 5,607,776 | 3/1997 | Mueller et al. | 428/472 |
| 5,630,690 | 5/1997 | Salzman | 414/217 |
| 5,630,916 | 5/1997 | Gerrish et al. | 204/192.2 |
| 5,630,917 | 5/1997 | Guo | 204/192.12 |
| 5,636,964 | 6/1997 | Somekh et al. | 414/786 |
| 5,643,366 | 7/1997 | Somekh et al. | 118/721 |
| 5,656,902 | 8/1997 | Lowrance | 318/568.1 |
| 5,658,442 | 8/1997 | Van Gogh et al. | 204/298.12 |
| 5,661,913 | 9/1997 | Kato et al. | |
| 5,674,786 | 10/1997 | Turner et al. | 437/225 |
| 5,678,980 | 10/1997 | Grunes et al. | 414/744.6 |
| 5,697,427 | 12/1997 | Ngan et al. | 165/80.1 |
| 5,697,750 | 12/1997 | Fishkin et al. | 414/217 |
| 5,730,801 | 3/1998 | Tepman et al. | 118/719 |
| 5,740,062 | 4/1998 | Berken et al. | 364/478.06 |
| 5,746,460 | 5/1998 | Marohl et al. | 294/1.1 |
| 5,746,897 | 5/1998 | Heimanson et al. | 204/298.2 |
| 5,747,360 | 5/1998 | Nulman | 437/189 |
| 5,764,012 | 6/1998 | Lowrance | 318/568.1 |
| 5,780,357 | 7/1998 | Xu et al. | 438/639 |
| 5,784,238 | 7/1998 | Nering et al. | 361/65 |
| 5,788,453 | 8/1998 | Donde et al. | 414/751 |
| 5,788,799 | 8/1998 | Steger et al. | 156/345 |
| 5,789,878 | 8/1998 | Kroeker et al. | 318/45 |
| 5,795,355 | 8/1998 | Moran | 29/25.01 |
| 5,799,860 | 9/1998 | Demaray et al. | 228/194 |
| 5,803,977 | 9/1998 | Tepman et al. | 118/728 |
| 5,810,937 | 9/1998 | Gupta et al. | 134/1.2 |
| 5,822,171 | 10/1998 | Shamouilian et al. | 361/234 |
| 5,824,197 | 10/1998 | Tanaka | 204/192.12 |
| 5,833,426 | 11/1998 | Marohl | 414/217 |
| 5,838,121 | 11/1998 | Fairbairn et al. | 318/45 |
| 5,844,195 | 12/1998 | Fairbairn et al. | 219/121.43 |
| 5,846,883 | 12/1998 | Moslehi | 438/711 |
| 5,851,602 | 12/1998 | Law et al. | 427/579 |
| 5,855,681 | 1/1999 | Maydan et al. | 118/719 |
| 5,861,086 | 1/1999 | Khurana et al. | 204/192.32 |
| 5,861,197 | 1/1999 | Law et al. | 427/579 |
| 5,871,588 | 2/1999 | Moslehi et al. | 118/730 |
| 5,871,811 | 2/1999 | Wang et al. | 427/248.1 |
| 5,877,086 | 3/1999 | Aruga | 438/653 |
| 5,879,127 | 3/1999 | Grunes et al. | 414/744.6 |
| 5,882,165 | 3/1999 | Maydan et al. | 414/217 |

* cited by examiner

IN-LINE SPUTTER DEPOSITION SYSTEM

RELATED APPLICATIONS

This application claims the benefit of U.S. Provisional Application Ser. No. 60/102,610, filed Oct. 1, 1998 and U.S. Provisional Application Ser. No. 60/116,721, filed Jan. 21, 1999. In addition, the application is related to U.S. patent application entitled "A Multi-Layer Sputter Deposition Apparatus," filed this Sep. 23, 1999 and currently owned by the present assignee.

FIELD OF THE INVENTION

The invention relates generally to apparatus and methods for processing substrates and more particularly to apparatus and methods for simultaneously processing multiple batches of substrates.

BACKGROUND INFORMATION

Microelectronic and electrooptic devices are fabricated by numerous sequential processing steps which include at least one step of depositing a thin metal or dielectric films onto substrates such as silicon, gallium arsenide, and glass. Thin metals and dielectrics are deposited in a vacuum chamber by numerous techniques known in the art, such as sputtering, evaporation, and Chemical Vapor Deposition (CVD). Sputtering is a versatile deposition technique because it can be used to deposit a wide variety of materials at relatively high deposition rates. Sputtering is particularly useful for depositing multiple layers of materials or materials with complex stochiometries.

Sputtering systems typically bias a target comprising the material to be sputtered at a relatively high voltage, typically about −500 volts, in a vacuum chamber filled with an inert gas such as argon, at pressures ranging from 0.1 mtorr to 100 mtorr. The bias potential induces a breakdown of the gas and the formation of a plasma glow discharge. The ions in the plasma are accelerated by the negative potential into the target thereby producing secondary atomic emission which deposits sputtered material on a substrate placed in the path of the sputtered ions. Magnetic fields are typically used to confine the plasma in order to increase the sputtering rate.

It is sometimes desirable to deposit multiple layers of different material on substrates without removing the substrates from the process chamber. However, most prior art sputtering systems are designed to depositing one material, which may be a single metal or dielectric or a combination of several metals or dielectrics. Thus, if multiple layers of different materials have to be deposited on substrates, the sputtering systems usually need to be reconfigured.

It is desirable to process multiple substrates simultaneously in order to increase process throughput and thus reduce the manufacturing costs of the end product. Modern deposition tools used in the microelectronics industry include multiple chambers and complex mechanical devices that transport the substrates between the chambers of the tools. Modern processing tools typically have numerous sections including at least one substrate storage area, a substrate preparation or cleaning area and a deposition chamber. There are three general design approaches to making high-throughput deposition tools.

Batch processing systems process an entire batch of substrate simultaneously. Substrates are either loaded in the process chamber one-by-one or they are loaded onto a pallet, which is then loaded into the process chamber. These tools can have a very high throughput, but they are difficult to automate. The throughput is typically limited by the substrate handling mechanisms. Batch systems have become less popular because they are difficult to scale to large wafer sizes.

Cluster tools include a plurality of process chambers that are clustered around a central platform. A transport mechanism or robot moves the substrates between the various process chambers. Typically, each process chamber attached to the cluster tool performs a single task and can be operated independent of the other process chambers. For example, the individual process chambers may clean substrates before processing, etch substrates or a film deposited on substrates, or deposit metal or dielectric films on substrates. The throughput of cluster tools can be very high because multiple chambers can process substrates simultaneously.

Typically, the deposition chambers within cluster tools are configured to deposit only one metal or dielectric film. Consequently, if the process requires multiple layers of metals or dielectric films, the multiple layers are sequentially deposited in different process chambers. State-of-the-art cluster tools typically have between about four and eight process chambers. Therefore, cluster tools have a limited capability to deposit multi-layer film coatings.

In-line processing tools process substrates one-by-one, through a series of process steps. In-line processing tools are versatile tools that have relatively high throughput. One disadvantage of in-line processing tools is that the throughput of these tools is limited by the process time of the longest process step. Another disadvantage of in-line tools is that they are physically very long in length compared to other processing tools because of their linear design and because separate stations are required for loading and unloading the substrates. In order to dimension these tools to fit into modern semiconductor processing facilities, where floor space is very costly, complex mechanical designs are often used.

SUMMARY OF THE INVENTION

An object of the present invention is to provide an in-line processing system that simultaneously transports substrates into or out of a load lock while processing substrates in at least one of a first process chamber and a second process chamber. A principle discovery of the present invention is that an in-line processing system can be constructed where a load lock, a sputter cleaning chamber, and a sputter deposition chamber can be operated simultaneously.

Accordingly, the present invention features an apparatus for simultaneously transporting and processing substrates. The substrates may be semiconductor wafers. The substrates may be positioned on a pallet or free standing. The apparatus includes a load lock that stores at least one substrate prior to processing and that stores at least one substrate after processing. The load lock may be a vacuum load lock. The load lock may include a first valve that defines a first end of the load lock for loading and unloading substrates and a second valve that defines a second end of the load lock. A robot arm positioned in an atmospheric pressure environment may be used to load at least one substrate into and out of the first end of the load lock.

A first transport mechanism transports at least one substrate into and out of the load lock. In one embodiment, the first transport mechanism comprises a plurality of tubes or solid members. A multi-stage elevator is adapted to receive the first transport mechanism. A first process chamber is vertically disposed from the multi-stage elevator. The multi-stage elevator vertically transports at least one substrate into and out of the first process chamber. In one embodiment, the multi-stage elevator includes a first and a second elevator stage, where the second stage is vertically aligned and separated from the first stage. Each of the first and the second elevator stage are adapted to support at least one substrate and to accept the first transport mechanism.

A second process chamber may be coupled to the multi-stage elevator. A second transport mechanism transports at least one substrate between the multi-stage elevator and the second process chamber. In one embodiment, the second transport mechanism comprises a plurality of tubes or solid members. The first process chamber may be a sputter cleaning chamber.

In one embodiment, the second process chamber is a multi-layer sputter deposition chamber that includes a plurality of magnetrons mounted on a rotatable member. The rotatable member may define an aperture that is substantially at atmospheric pressure. A predetermined one of the plurality of magnetron is positionable proximate to a substrate in the second process chamber. A transport mechanism transports the substrate proximate to the predetermined one of the plurality of magnetron in a first and a second direction. The second direction may be substantially opposite to the first direction.

The present invention also features a method of simultaneously transporting a batch of substrates in an apparatus while processing a batch of substrates in at least one process chamber of the apparatus. A first batch of substrates is transported from a substrate carrier into a load lock and then from the load lock to a first stage of a multi-stage elevator. The first stage of the multi-stage elevator is then positioned into a first process chamber.

The first batch of substrates is processed with a first process and then the first stage of the multi-stage elevator supporting the first batch of processed substrates is positioned adjacent to a second chamber. The first batch of processed substrates is transported from the first stage of the multi-stage elevator to the second process chamber. A second batch of substrates is then loaded in the apparatus for simultaneous processing.

The second batch of wafer is transported from a substrate carrier into the load lock and then from the load lock to the first stage of the multi-stage elevator. The first stage of the multi-stage elevator supporting the second batch of substrates is then positioned into the first chamber. The first and second batches of substrates are then simultaneously processed. That is, the first batch of substrates is processed in the second chamber with a second process while the second batch of substrates is processed in the first chamber with the first process. The first process may be a sputter cleaning process and the second process may be a multi-layer deposition process.

After the first batch of substrates is processed by the first and the second process, it is stored in the apparatus while a third batch of substrates is being positioned for processing. The second stage of the multi-stage elevator is positioned adjacent to the second chamber. The first batch of processed substrates is then transported from the second chamber to the second stage of the multi-stage elevator.

The second batch of processed substrates is then transported into the second process chamber while a third batch of substrates is transported into the system. The first stage of the multi-stage elevator with the second batch of substrates is positioned adjacent to the second process chamber. The second batch of processed substrates is then transported from the first stage of the multi-stage elevator to the second process chamber. The third batch of substrates is then transported from the substrate carrier into the load lock and then from the load lock to the first stage of the multi-stage elevator. The first stage of the multi-stage elevator with the third batch of substrates is positioned in the first process chamber.

The second and third batches of substrates are then simultaneously processed while the first batch of processed substrates is removed from the apparatus. That is, the second batch of substrates is processed in the second chamber with a second process and the third batch of substrates is processed in the first chamber with the first process. The first batch of substrates is transported from the second stage of the multi-stage elevator to the load lock and then to the substrate carrier.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION OF THE INVENTION

Figure 1:
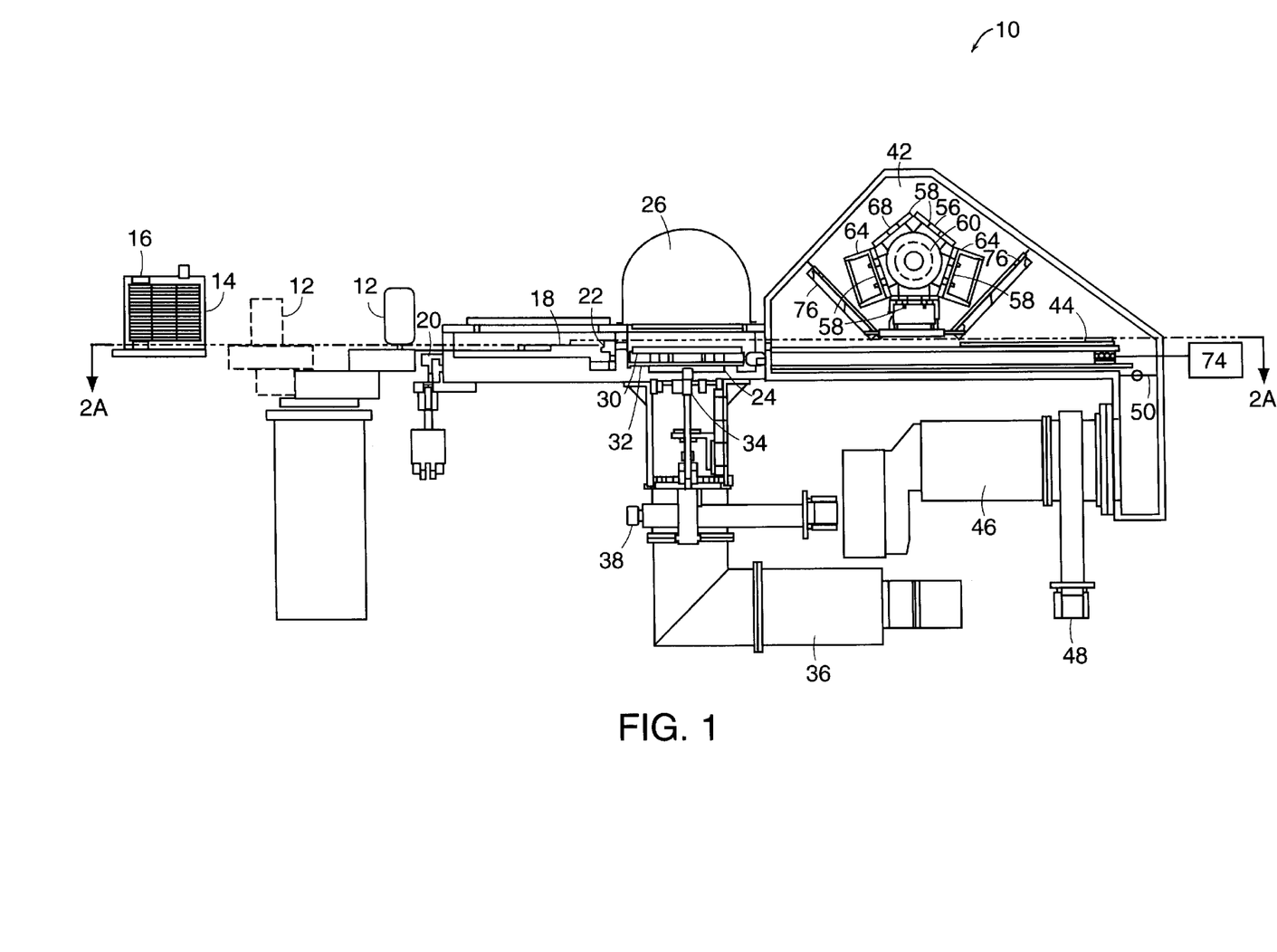
FIG. 1 is a side, schematic view of an in-line processing apparatus according to the invention.

FIG. 1 is a side, schematic view of an in-line processing apparatus 10 according to the invention. The apparatus 10 includes a robot arm 12 that transports a substrate or a batch of substrates 14 from a substrate carrier 16 into a load lock 18. The substrates 14 may be semiconductor wafers or glass substrates. The substrates 14 may be supported by a pallet 15 or any type of substrate carrier known in the art.

In one embodiment, the robot arm 12 is a rotatable multi-segmented arm that is positionable between a first position proximate to the substrate carrier 16 (as shown in dotted view) and a second position that is proximate to the load lock 18 (as shown in solid view). The robot arm 12 is movable vertically to enable it to load and unload substrates from different vertical levels of the substrate carrier 16.

The load lock 18 stores at least one substrate prior to processing and stores at least one substrate after processing. The load lock 18 has a first valve 20 that is proximate to the robot arm 12 that defines the first end of the load lock 18.

The load lock 18 has a second valve 22 that is proximate the multi-stage elevator 24 that defines the second end of the load lock 18. In one embodiment, the first 20 and second valves 22 are flapper valves.

A first process chamber 26 is coupled to the load lock 18. In one embodiment, the first chamber 26 is a sputter clean chamber that prepares the substrates for further processing. A multi-stage elevator 24 is positioned under the first chamber 26. The multi-stage elevator 24 includes at least two vertically aligned and separated stages 30 and 32 that support the substrates 14. The multi-stage elevator 24 is coupled to a driving mechanism 34 that vertically positions the multi-stage elevator 24. The driving mechanism may be any mechanism known in the art.

A vacuum pump 36, such as a cryogenic vacuum pump, is coupled to the bottom of the multi-stage elevator 24 by a gate valve 38. The vacuum pump 36 evacuates the multi-stage elevator 24, the first process chamber 26, and the load lock 18 to high vacuum. A first transport mechanism 40 (FIGS. 2 and 3), such as the transport mechanism described in connection with FIGS. 2 and 3, transports substrates 14 between the load lock 18 to the multi-stage elevator 24.

A second process chamber 42 is also coupled to the load lock 18. A second transport mechanism 44, such as the transport mechanism described in connection with FIGS. 2 and 3, transports substrates 14 between the multi-stage elevator 24 and the second process chamber 42. The second process chamber 42 may be a multi-layer deposition chamber as described in connection with FIG. 5. A vacuum pump 46, such as a cryogenic vacuum pump, is coupled to the second process chamber 42 by a gate valve 48. The vacuum pump 46 evacuates the second process chamber 42 to high vacuum. A throttle valve 50 is positioned between the second process chamber 42 and the vacuum pump 46. The throttle valve 50 changes the conductance to the pump and, therefore, the pressure inside the second process chamber 42.

Figure 2:
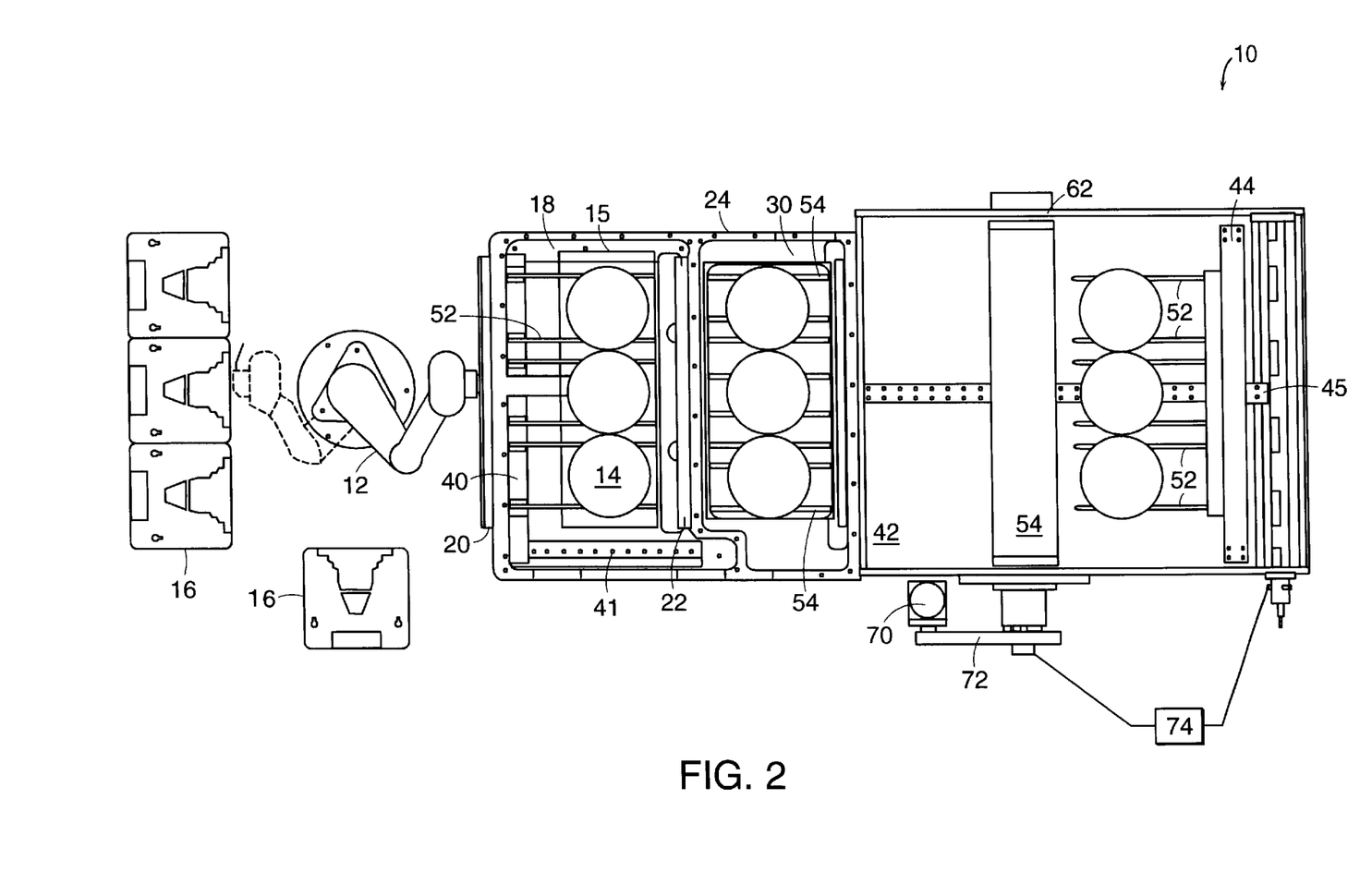
FIG. 2 is a top, schematic, cross-sectional view taken along section 2A—2A of FIG. 1 of an in-line processing apparatus according to the present invention.

FIG. 2 is a top, schematic, cross-sectional view taken along section 2A—2A of FIG. 1 of an in-line processing apparatus 10 according to the present invention. FIG. 2 illustrates the various transport mechanisms of the apparatus. FIG. 2 illustrates a top view of the robot arm 12 and several substrate carriers 16. The first transport mechanism 40 is shown coupled to a driving mechanism 41 that transports substrates 14 between the load lock 18 and a stage of the multi-stage elevator 30 or 32. The second transport mechanism 44 is shown coupled to a second driving mechanism 45 that transports substrates 14 between a stage of the multi-stage elevator 30 or 32 and the second process chamber 42.

The first 40 and second transport mechanism 44 includes a plurality of members or fingers 52 that support and translate substrates or a carrier supporting substrates between the load lock 18 and the stages 30 and 32 of the multi-stage elevator 24. The fingers 52 may be solid members or may be tubes. The at least two vertically aligned and separated stages 30 and 32 of the multi-stage elevator include grooves 54 that receive the fingers 52 of the first 40 and second transport mechanism 44.

Figure 3A:
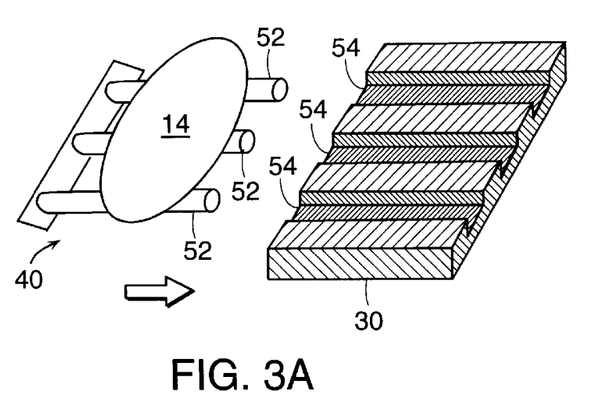
FIGS. 3a–3d are schematic diagrams that illustrate an embodiment of a substrate transport mechanism according to the present invention.
Figure 3B:
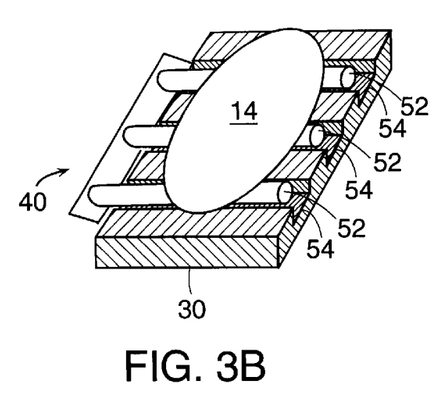

FIGS. 3a–3d are schematic diagrams that illustrate an embodiment of the substrate transport mechanism 40 and 44 according to the present invention. FIG. 3a illustrates a perspective view of the substrate 14 being supported by the fingers 52 of the transport mechanism 40 and the stage 30 of the multi-stage elevator 24. Although FIG. 3 is illustrated as transporting a single substrate, in one embodiment of the invention, the transport mechanism transports a batch of substrates. FIG. 3b illustrates the fingers 52 positioned in the grooves 54 of the stage 30 of the multi-stage elevator 24.

Figure 3C:
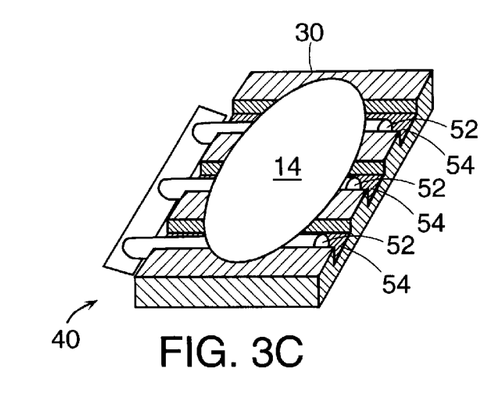
Figure 3D:
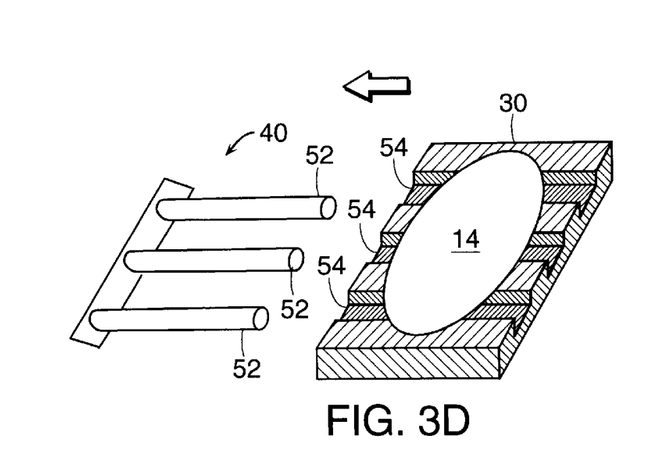

FIG. 3c illustrates the substrate 14 being supported by the stage 30 of the multi-stage elevator 24. The multi-stage elevator 24 is raised so that the substrate 14 is transferred from the transport mechanism 40 to the stage 30 of the multi-stage elevator 24. FIG. 3d illustrates the transport mechanism 40 moving away from the stage 30. The multi-stage elevator 24 may now be elevated to transport the substrates 14 to the first process chamber 26.

Figure 4A:
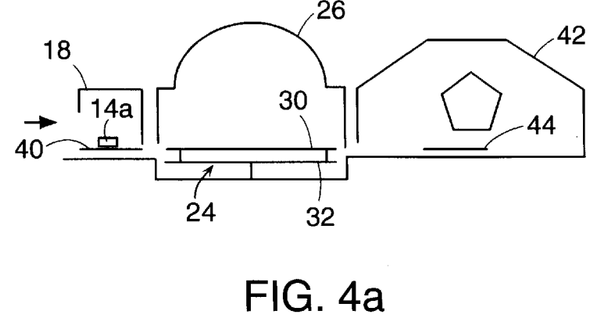
FIGS. 4a–4j illustrate the movement of substrates through an embodiment of the in-line processing apparatus of the present invention.

FIGS. 4a through 4j illustrate the movement of substrates through an embodiment of the in-line processing apparatus of the present invention where the first process chamber is a sputter clean chamber and the second process chamber is a sputter deposition chamber. FIG. 4a illustrates a first substrate 14a positioned in the load lock 18. Although FIG. 4 is illustrated with one substrate, in one embodiment of the invention, a batch of substrates is processed. After the first substrate 14a has been moved into the load lock 18, the load lock 18 is evacuated by vacuum pump 36. A first transport mechanism 40 transports the first substrate 14a from the load lock 18 into the multi-stage elevator 24. In the embodiment shown, the multi-stage elevator 24 includes a first stage 30 and a second stage 32.

Figure 4B:
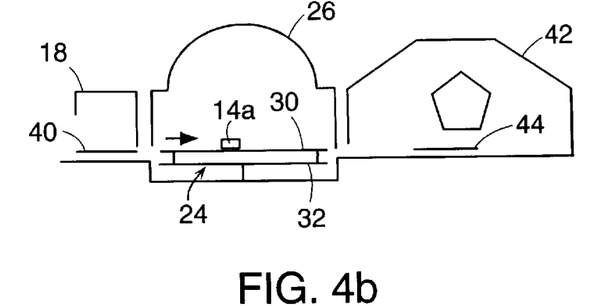

FIG. 4b illustrates the first substrate 14a positioned on the first stage 30 of the multi-stage elevator 24. The multi-stage elevator 24 then vertically raises the first substrate 14a into the sputter cleaning chamber 26. The first substrate 14a is sputter cleaned in the chamber 26. The multi-stage elevator 24 then vertically lowers the first substrate 14a adjacent to the sputter deposition chamber 42.

Figure 4C:
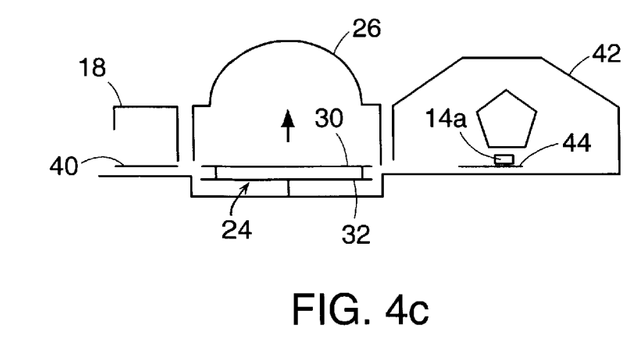
Figure 4D:
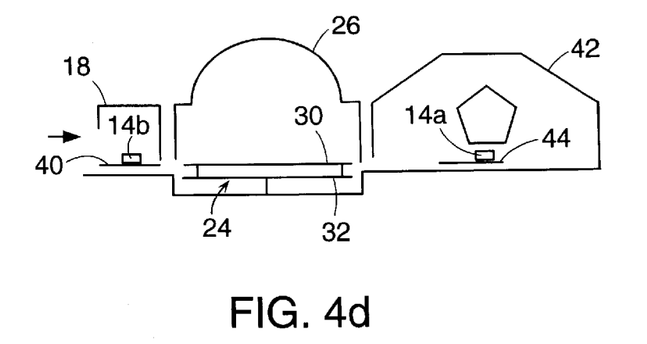

FIG. 4c illustrates the first substrate 14a being transferred from the first stage 30 of the multi-stage elevator 24 into the sputter deposition chamber 42. FIG. 4d illustrates both the first substrate 14a being processed in the sputter deposition chamber 42 and a second substrate 14b positioned in the load lock 18.

Figure 4E:
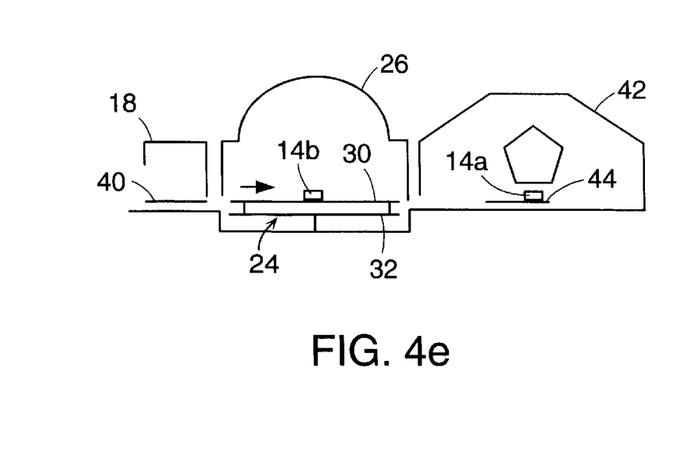

FIG. 4e illustrates the second substrate 14b being positioned on the first stage 30 of the multi-stage elevator 24. The multi-stage elevator 24 vertically transports the second substrate 14b into the sputter cleaning chamber 26. Both the first substrate 14a and the second substrate 14b are processed simultaneously in the sputter deposition chamber 42 and sputter cleaning chamber 26, respectively.

Figure 4F:
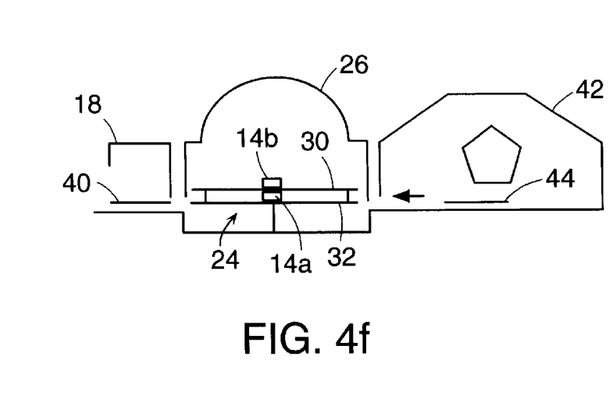
Figure 4G:
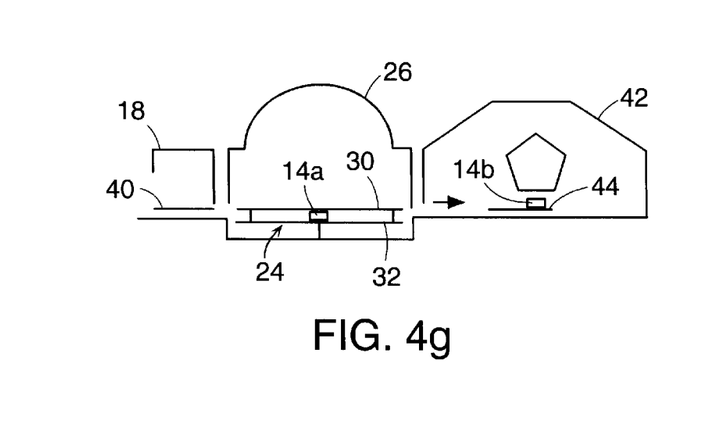

FIG. 4f illustrates the first substrate 14a being transported by the second transport mechanism 44 to the second stage 32 of the multi-stage elevator 24. The multi-stage elevator 24 then lowers the second substrate 14b so that it is adjacent to the sputter deposition chamber 42. FIG. 4g illustrates the second substrate 14b being transported by the second transport mechanism 44 from the first stage 30 of the multi-stage elevator 24 to the sputter deposition chamber 42.

Figure 4H:
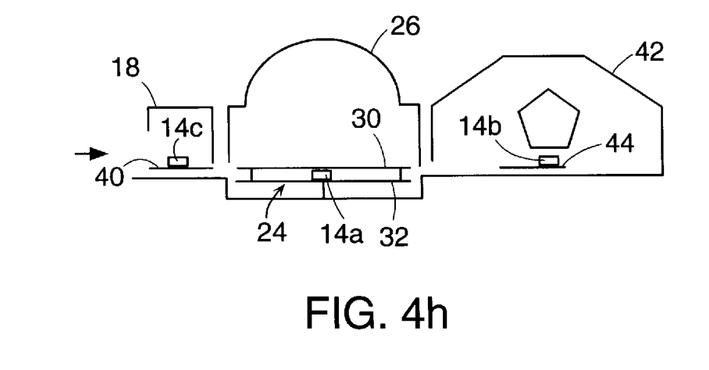
Figure 4I:
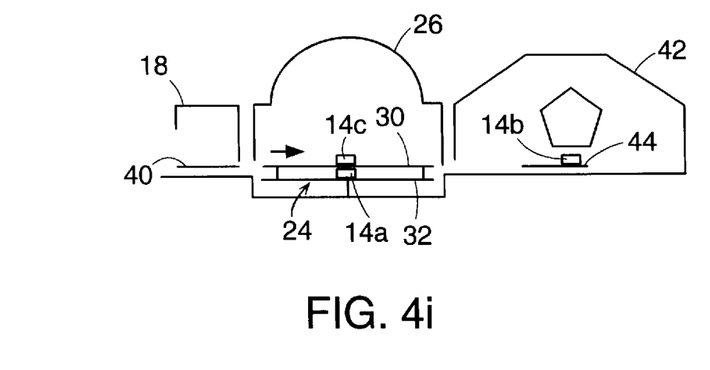

FIG. 4h illustrates a third substrate 14c being positioned in the load lock 18 while the second substrate 14b is being positioned in the sputter deposition chamber 42. FIG. 4i illustrates the third substrate 14c being transported to the first stage 30 of the multi-stage elevator 24. The elevator 24 then vertically transports the third substrate 14c into the sputter cleaning chamber 26 and positions the first substrate 14a adjacent to the load lock 18.

Figure 4J:
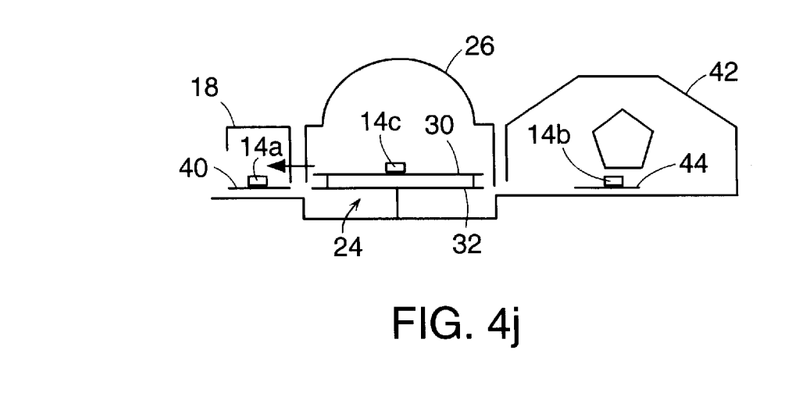

FIG. 4J illustrates the first substrate 14a being transported from the second stage 32 of the multi-stage elevator 24 into the load lock 18, while the second substrate 14b and third substrate 14c are being simultaneously processed. The first substrate 14a is then transported from the load lock 18 to the substrate carrier 16. The process repeats for subsequent substrates. One of the advantages of the apparatus described in connection with FIG. 4 is that two batches of wafers can be processed simultaneously while a third batch of substrates is being transported into and out of the load lock 18.

Figure 5:
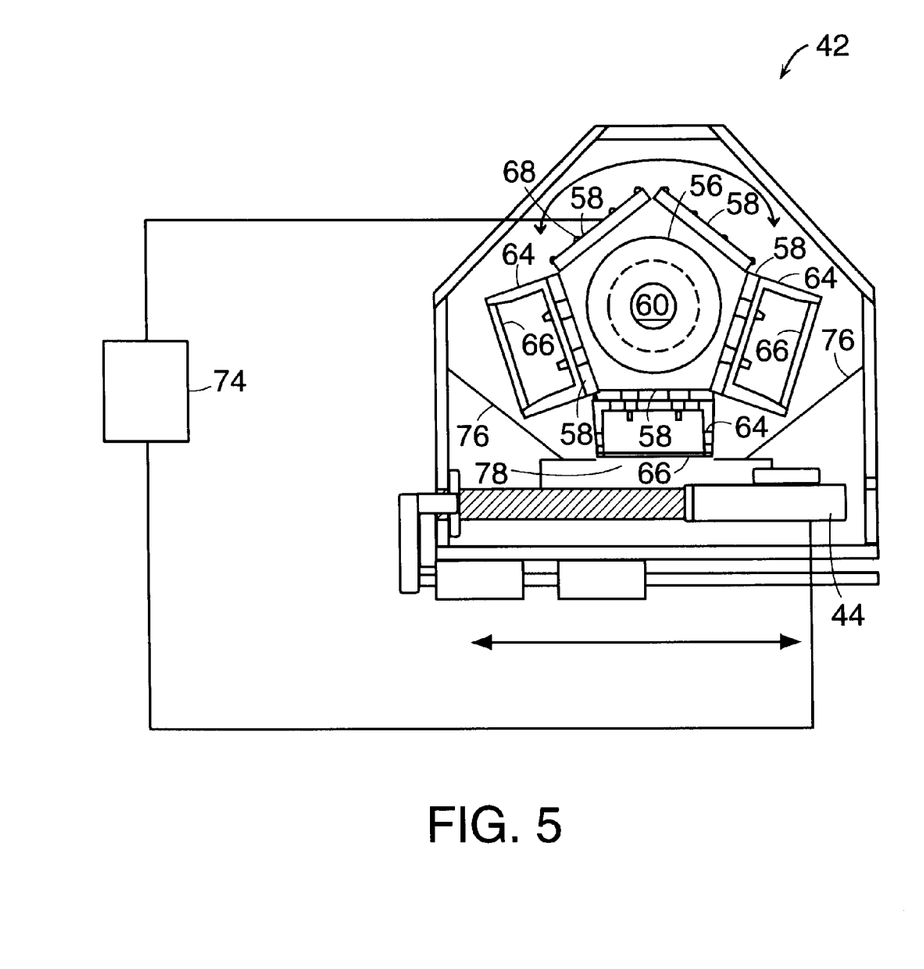
FIG. 5 is a side cross-sectional view of one embodiment of a multi-layer sputter disposition chamber according to the present invention.

FIG. 5 is a side cross-sectional view of one embodiment of a multi-layer sputter disposition chamber 42 according to the present invention. A rotatable member, such as a drum 56, is positioned in the chamber 42. The drum 56 rotates about a bearing. In one embodiment, the drum 56 defines a plurality of relatively flat surfaces or faces 58 on the outer surface of the drum 56. For example, the drum 56 may be pentagonal in shape with five faces 58.

In one embodiment, the rotatable member defines an aperture 60. The rotatable member may include a ferrofluidic conduit 62 (FIG. 2) in the aperture 60 for passing electrical wires and cooling fluid pipes from a power supply and fluid source into the drum 56. The ferrofluidic conduit 62 also provides a vacuum seal between the aperture 60, which is maintained at substantially atmospheric pressure, and the faces 58 of the drum 56, which are maintained at high vacuum in the sputter deposition chamber 42.

In one embodiment, each of the plurality of magnetrons 64 is positioned on one of the relatively flat surfaces 58 of the drum 56. Sputtering targets 66 are positioned proximate to each of the plurality of magnetrons 64. The width of the sputtering targets typically exceeds the diameter of the substrates. The sputter targets 66 may be compound sputtering targets that comprise at least two different materials to be sputtered. Electrical wires and cooling fluid pipes are fed through the ferrofluidic conduit 62 (FIG. 2).

In one embodiment, at least one face 58 of the drum 56 includes a removable flange 68 for providing access to the magnetrons 64 for configuration, maintenance and repair. In one embodiment, the drum is coupled to a motor 70 (FIG. 2) either directly or by a drive belt 72 (FIG. 2). A processor 74 (FIG. 2) is in electrical communication with the motor 70 and may instruct the drum 56 to position a predetermined one of the plurality of magnetrons 64 under a substrate 14.

A shield 76 may be positioned in the sputter deposition chamber 42 to prevent sputtered material from contaminating system components, such as the sputtering chamber 42, drum 56, magnetrons 64, and unused sputtering targets. In one embodiment, the shield 76 defines an aperture 78 that is dimensioned to receive a sputtering target 66.

The second transport mechanism 44 transports the substrate 14 across the sputtering target 66. The second transport mechanism 44 may be a linear drive mechanism that transports the substrate 14 in a first direction and a second direction that is substantially opposite to the first direction. The processor 74 may be in electrical communication with the transport mechanism 44 and instruct the transport mechanism 44 to transport the substrates 14 proximate to a predetermined one of the plurality of magnetrons 64.

The present invention also features a method of sputter depositing multiple layers of material onto a substrate. The method includes positioning a first sputtering apparatus comprising a first sputtering target proximate to a substrate in a sputter deposition chamber. The first sputtering apparatus is activated thereby sputtering first target material onto the substrate. The first target material may be sputtered from a compound sputtering target. The substrate is transported in a path of sputtered first target material in a first direction and then in a second direction that is substantially opposite to the first direction.

A second sputtering apparatus comprising a second sputtering target is then positioned proximate to the substrate in the sputter deposition chamber. The second sputtering apparatus is activated thereby sputtering second target material onto the substrate. The second target material may be sputtered from a compound sputtering target. The substrate is transported in a path of sputtered second target material in the first direction and then in a second direction that is substantially opposite to the first direction.

The substrates can be transported in the path of sputtered first and second target material any number of times in order to achieve the desired film uniformity. In addition, the transport rate can be adjusted to achieve the desired film uniformity.

Figure 6:
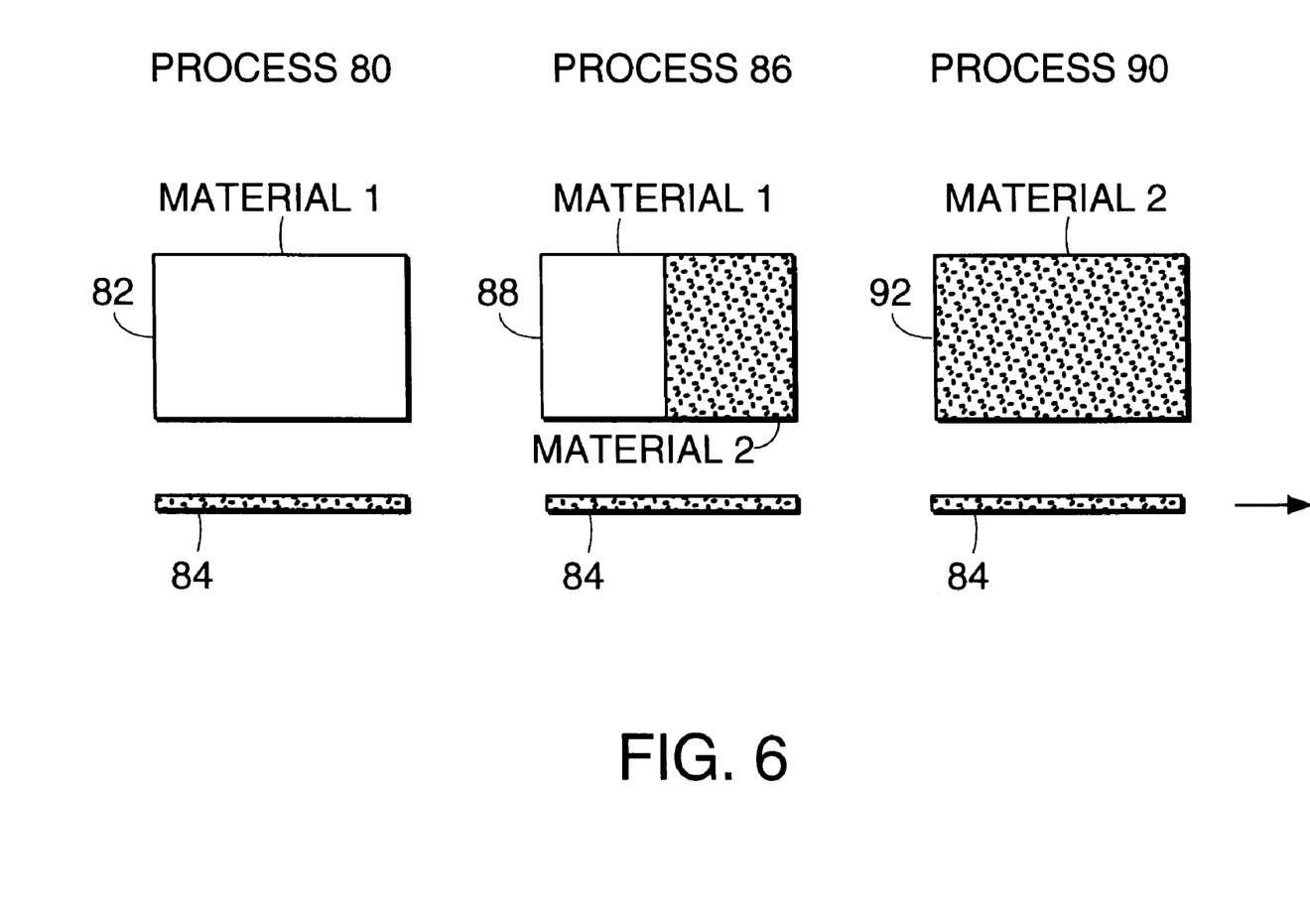
FIG. 6 illustrates a schematic view of a sequential phase-in deposition of two materials using the sputtering deposition system of the present invention.

FIG. 6 illustrates a schematic view of a sequential phase-in deposition of two materials using the sputtering deposition system of the present invention. Three sequential sputtering processes are illustrated. The first sputtering process 80 shows a first sputtering target 82 above a substrate 84. The substrate 84 is transported in a path of the sputtered material. The second sputtering process 86 shows a compound sputtering target 88 above the substrate 84. By compound sputtering target we mean that the sputtering target comprises at least two different materials. The substrate 84 is transported in a path of the sputtered material, which is at least two different sputtered materials. The third sputtering process 90 shows a third sputtering target 92 above the substrate 84. The substrate 84 is transported in a path of the sputtered material.

The substrate 84 may be transported across the sputtering targets in only one direction. Alternatively, the substrate may be transported in a first and a second direction, where the second direction is substantially opposite the first direction, as described in connection with the apparatus 10 of FIG. 1.

In one embodiment of the invention, the sequential phase-in deposition is a sequential chromium/copper phase-in deposition. The first sputtering target is a chromium sputtering target. The compound sputtering target is a chromium/copper sputtering target. The second sputtering target is a copper sputtering target.

The present invention also features a method of phase-in deposition using the sputtering deposition system of the present invention. The method includes positioning a first sputtering apparatus comprising a first sputtering target proximate to a substrate in a sputter deposition chamber. The first sputtering apparatus is activated thereby sputtering a first material, such as chromium, onto the substrate. The substrate is then transported in a path of the sputtered material. The substrates may be transported in a first and a second direction, where the second direction is substantially opposite the first direction.

A second sputtering apparatus comprising a compound sputtering target is positioned proximate to the substrate in the sputter deposition chamber. The second sputtering apparatus is activated thereby sputtering at least two materials, such as chromium and copper onto the substrate. The substrate is transported in a path of the sputtered material. The substrates may be transported in a first and a second direction, where the second direction is substantially opposite the first direction. Sputtering with the compound sputtering target allows the gradual introduction of at least two materials with any desired proportion.

A third sputtering apparatus comprising a third sputtering target is positioned proximate to the substrate in the sputter deposition chamber. The third sputtering apparatus is activated thereby sputtering copper onto the substrate. The substrate is transported in a path of copper ions. The substrates may be transported in a first and a second direction, where the second direction is substantially opposite the first direction.

Figure 7:
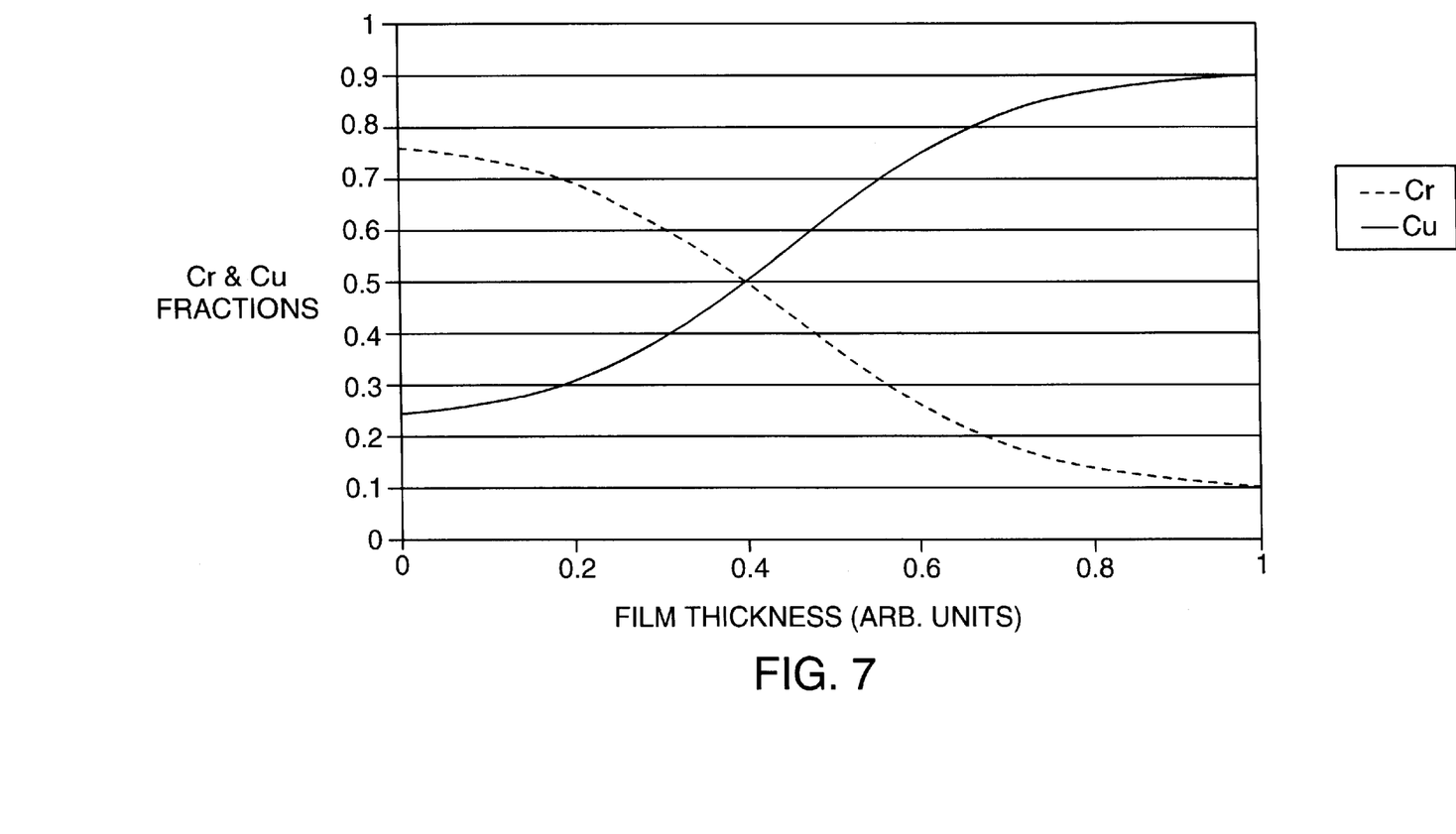
FIG. 7 is a graph illustrating chromium and copper distribution as a function of film thickness for a chromium/copper sequential phase-in deposition using the sputtering deposition system of the present invention.

FIG. 7 is a graph illustrating the chromium and copper distribution as a function of film thickness for a chromium/copper sequential phase-in deposition according to the present invention. The fraction of chromium in the deposited film gradually decreases while the fraction of copper in the deposited film gradually increases. For the process illustrated in FIG. 6, the cross over point where the fractions of chromium and copper are each approximately 50% corresponds to a film thickness of approximately 40%. By varying the process parameters, the sputtering rate for each of the three depositions can be modified to obtain a film with the desired fractions of chromium and copper.

EQUIVALENTS

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. An apparatus for simultaneously transporting and processing substrates, the apparatus comprising:
   a) a load lock that stores at least one substrate prior to processing and that stores at least one substrate after processing;
   b) a first transport mechanism that transports at least one substrate into and out of the load lock;
   c) a multi-stage elevator that is adapted to receive the first transport mechanism; and
   d) a first process chamber vertically disposed from the multi-stage elevator,
      wherein the multi-stage elevator vertically transports at least one substrate into and out of the first process chamber.

2. The apparatus of claim 1 wherein the load lock comprises a vacuum load lock.

3. The apparatus of claim 1 wherein the load lock comprises a first valve that defines a first end of the load lock and a second valve that defines a second end of the load lock, the second end of the load lock being adjacent to the multi-stage elevator.

4. The apparatus of claim 1 further comprising:
   a) a second process chamber coupled to the multi-stage elevator; and
   b) a second transport mechanism that transports at least one substrate between the multi-stage elevator and the second process chamber.

5. The apparatus of claim 4 wherein the apparatus simultaneously transports at least one substrate into or out of the load lock while processing at least one substrate in at least one of the first process chamber and the second process chamber.

6. The apparatus of claim 4 wherein the apparatus simultaneously processes at least one substrate in both the first process chamber and the second process chamber.

7. The apparatus of claim 4 wherein at least one of the first process chamber and the second process chamber comprises a sputter cleaning chamber.

8. The apparatus of claim 4 wherein at least one of the first process chamber and the second process chamber comprises a sputter deposition chamber.

9. The apparatus of claim 4 wherein at least one of the first transport mechanism and the second transport mechanism comprises a plurality of substantially solid members.

10. The apparatus of claim 4 wherein at least one of the first transport mechanism and the second transport mechanism comprises a plurality of tubes.

11. The apparatus of claim 4 wherein the second process chamber further comprises:
    a) a plurality of magnetrons mounted on a rotatable member, wherein a predetermined one of the plurality of magnetron is positionable proximate to a substrate in the second process chamber; and
    b) a transport mechanism that transports the substrate proximate to the predetermined one of the plurality of magnetron in a first and a second direction.

12. The apparatus of claim 11 wherein the rotatable member defines an aperture.

13. The apparatus of claim 11 wherein the second direction is substantially opposite to the first direction.

14. The apparatus of claim 1 wherein the multi-stage elevator comprises:
    a) a first elevator stage adapted to support at least one substrate;
    b) a second elevator stage adapted to support at least one substrate, the second elevator stage being vertically aligned and separated from the first elevator stage, wherein the first elevator stage and the second elevator stage are adapted to accept the first transport mechanism.

15. The apparatus of claim 1 further comprising a robot arm that loads at least one substrate into and out of the first end of the load lock.

16. The apparatus of claim 15 wherein the robot arm is positioned in an atmospheric pressure environment.

17. The apparatus of claim 1 wherein at least one substrate comprises a semiconductor wafer.

18. The apparatus of claim 1 wherein at least one substrate is positioned on a pallet.

19. A method of simultaneously transporting a batch of substrates in an apparatus while processing a batch of substrates in at least one process chamber of the apparatus, the method comprising the steps of:
    a) transporting a first batch of substrates from a substrate carrier into a load lock;
    b) transporting the first batch of substrates from the load lock to a first stage of a multi-stage elevator;
    c) positioning the first stage of the multi-stage elevator supporting the first batch of substrates into a first chamber;
    d) processing the first batch of substrates in the first chamber with a first process;
    e) positioning the first stage of the multi-stage elevator supporting the first batch of processed substrates adjacent to a second chamber;
    f) transporting the first batch of processed substrates from the first stage of the multi-stage elevator to the second chamber; and
    g) transporting a second batch of substrates from a substrate carrier into the load lock.

20. The method of claim 19 further comprising the steps of:
    a) transporting the second batch of substrates from the load lock to the first stage of the multi-stage elevator; and
    b) positioning the first stage of the multi-stage elevator supporting the second batch of substrates into the first chamber.

21. The method of claim 20 further comprising the step of simultaneously processing the first batch of substrates in the second chamber with a second process and the second batch of substrates in the first chamber with the first process.

22. The method of claim 21 further comprising the steps of:
   a) transporting the first batch of processed substrates from the second chamber to a second stage of the multi-stage elevator; and
   b) positioning the first stage of the multi-stage elevator with the second batch of substrates adjacent to the second process chamber.

23. The method of claim 22 further comprising the step of transporting the second batch of processed substrates from the first stage of the multi-stage elevator to the second process chamber.

24. The method of claim 23 further comprising the steps of:
   a) transporting a third batch of substrates from a substrate carrier into the load lock;
   b) transporting the third batch of substrates from the load lock to the first stage of the multi-stage elevator; and
   c) positioning the first stage of the multi-stage elevator with the third batch of substrates in the first process chamber.

25. The method of claim 24 further comprising the step of simultaneously processing the second batch of substrates in the second chamber with a second process and the third batch of substrates in the first chamber with the first process.

26. The method of claim 25 further comprising the steps of:
   a) transporting the first batch of substrates from the second stage of the multi-stage elevator to the load lock; and
   b) transporting the first batch of substrates from the load lock to the substrate carrier.

27. The method of claim 26 wherein the following steps occur simultaneously:
   a) transporting the first batch of substrates from the second stage of the multi-stage elevator to the load lock;
   b) transporting the first batch of substrates from the load lock to the substrate carrier; and
   c) simultaneously processing the second batch of substrates in the second chamber with a second process and the third batch of substrates in the first chamber with the first process.

* * * * *